(12) United States Patent  
Günther et al.

(10) Patent No.: US 6,323,583 B1
(45) Date of Patent: Nov. 27, 2001

(54) PIEZOELECTRIC TRANSDUCER FOR INCORPORATION INTO A MODULE

(75) Inventors: Jürgen Günther, Stockheim; Stefan Klump, Lichtenfels; Michael Riedel, Rödental, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/694,464

(22) Filed: Oct. 23, 2000

Related U.S. Application Data

(63) Continuation of application No. PCT/DE99/01132, filed on Apr. 15, 1999, now abandoned.

(30) Foreign Application Priority Data

Apr. 24, 1998 (DE) .............................................. 198 18 449

(51) Int. Cl.$^7$ ................................................... H01L 41/04
(52) U.S. Cl. ......................... 310/330; 310/331; 310/332; 310/365
(58) Field of Search ...................... 310/330, 331, 310/332, 321, 365, 366

(56) References Cited

U.S. PATENT DOCUMENTS

| | | | |
|---|---|---|---|
| 3,821,747 | * 6/1974 | Mason | 310/332 |
| 4,193,010 | * 3/1980 | Kompanek | 310/330 |
| 4,328,442 | * 5/1982 | Tanaka et al. | 310/321 |
| 4,340,835 | * 7/1982 | Nakamura et al. | 310/321 |
| 4,538,087 | * 8/1985 | Germano et al. | 310/332 |
| 4,595,338 | * 6/1986 | Kolm et al. | 310/330 |
| 5,008,582 | * 4/1991 | Tanuma et al. | 310/332 |
| 5,834,650 | * 11/1998 | Kim | 73/651 |

* cited by examiner

Primary Examiner—Nestor Ramirez
Assistant Examiner—Peter Medley
(74) Attorney, Agent, or Firm—David M. Quinlan, P.C.

(57) ABSTRACT

A piezoelectric bending transducer comprises a flat, electrically conductive supporting body having piezoceramic coatings on both sides. Each coating has an inner contact area facing the supporting body and an outer contact area facing away from the supporting body. The piezoceramic coatings are omitted from one end of the supporting body, which is fixed in a connector base. Each of the two coatings and the supporting body are electrically connected to a plug-in contact that includes an electrically conductive elastomer in a cavity in the connecting body. The elastomer is partially elastically deformed by a contact pin inserted thereinto. As a result of the ease with which electrical connections can thus be made to the transducers, this arrangement is particulary adapted for incorporation into a transducer module with plural transducers secured adjacent to each other in a common connector base. The transducer module in turn is particularly adapted for use in a control module because of the easy interchangeability of the transducer modules.

17 Claims, 3 Drawing Sheets

PIEZOELECTRIC TRANSDUCER FOR INCORPORATION INTO A MODULE

CROSS-REFERENCE TO RELATED APPLICATIONS

This application is a continuation of International Application PCT/DE99/01132, with an international filing date of Apr. 15, 1999, now abandoned.

BACKGROUND OF THE INVENTION

1. Field of the Invention

The present invention relates to a piezoelectric bending transducer and, more particularly, to a flat piezoelectric bending transducer adapted for incorporation into a module comprising a plurality of such transducers.

2. Description of Related Art

Piezoelectric bending transducers are used in applications that can exploit the indirect or reciprocal piezoelectric effect, that is, the transformation of electrical energy into mechanical energy. A piezoelectric element of this type is equally suited, however, for transforming mechanical energy into electrical energy by exploiting the direct piezoelectric effect.

There are many technical applications for piezoelectric bending transducers. For example, they can be used in a piezoelectric print head for an ink-jet printer, or such a transducer can be used as a sensor for the measurement of acceleration or pressure, as an actuating element for transmitting pattern information in a weaving or knitting machine, and as an actuating element in a line of Braille in a reader for the blind, in a pneumatic valve, in a recording measuring instrument or in a contactless surface-measuring instrument, just to name a few uses.

Flat piezoelectric bending transducers are shown in DE 195 20 796 A1, DE 40 25 436 A1 (U.S. Pat. No. 5,404,067) and DE 196 20 826 B1. In such transducers, the application of a voltage between an outer contact area and an inner contact area causes contraction or expansion of a piezoelectric coating, depending on its polarity, so that the entire transducer bends or so that, if one end of the transducer is held fixed, the other end is deflected in a defined way. Conversely, a voltage between the inner contact area and the outer contact area is produced if the bending transducer is mechanically deformed from a neutral rest position.

Control modules including plural piezoelectric transducers are shown in U.S. Pat. No. 3,961,501 and EP 210 790 A2. Such a module, having a plurality of piezoelectric bending transducers, can be used for converting an electronic information signal into a mechanical deformation that can be sensed. For example, a module with a multiplicity of electrical bending transducers arranged in parallel can be used for driving needles or loop-forming elements of a weaving or knitting machine. For pattern forming in the goods produced by a textile machine, the information as to whether or not a loop is to be formed is obtained by mechanically sensing the deflection of a corresponding piezoelectric bending transducer.

In the case of both a piezoelectric bending transducer and a module with a plurality of such transducers, an electrical connection must be provided to contact areas on the piezoelectric coating. DE 40 25 436 A1 forms an outer contact area of the piezoelectric coating as a thin metal layer, and provides an electrical connection to the coating by soldering a corresponding connecting wire onto the metal layer. For electrically connecting the inner contact area, DE 40 25 436 A1 discloses placing a metal platelet between the piezoelectric coating and a supporting body for the coating, and then soldering a connecting wire to the platelet. Thus, electrical connections with the contact areas take place via a soldered contact and a corresponding connecting wire.

However, that is not an optimum arrangement because the operation of soldering a connecting wire onto a relatively small component such as a piezoelectric bending transducer is difficult to automate, and that therefore incurs disadvantageously high production costs. In addition, a high level of reliability is required for most applications of piezoelectric bending transducers, and in particular for modules made up of a plurality of such transducers. Both the soldered contact and the connecting wire represent points of potential failure, thus reducing the reliability of the transducer and therefore of the module. Moreover, replacing a built-in bending transducer or a built-in module with conventional soldered contacts is relatively complicated.

DE 36 34 484 A1 proposes that the electrical connections to the transducer be via conductive rubber. For this purpose, the conductive rubber is permanently clamped between a housing and the transducer. However, that is still not an optimum arrangement for some applications.

SUMMARY OF THE INVENTION

It is an object of the invention to simplify the electrical connections to a piezoelectric bending transducer.

It is a further object of the invention to provide a module with a plurality of piezoelectric bending transducers, the electrical connections to which are simplified and made more reliable and problem-free.

In accordance with one aspect of the invention, a piezoelectric bending transducer comprises a flat supporting body having a piezoelectrically active coating on at least one side thereof, the coating having an inner contact area facing the supporting body and an outer contact area facing away from the supporting body, and at least one electrical plug-in contact electrically connected to one of the contact areas, the plug-in contact including an electrically conductive elastomer for accepting a contact pin that deforms the elastomer when inserted thereinto.

In accordance with another aspect of the invention, a transducer module includes a plurality of such transducers secured in a common terminal strip adjacent to each other.

In accordance with yet another aspect of the invention, such a transducer module is incorporated into a control module with circuitry for selectively actuating the plural transducers and control elements responsive to actuation of the transducers.

BRIEF DESCRIPTION OF THE DRAWINGS

Exemplary embodiments of the invention are explained in more detail with reference to the accompanying drawings, in which.

It will be appreciated that these figures are in part diagrammatic and not to scale, in particular in terms of their spatial arrangement. In addition, like components are given the same reference numerals and letters in the different figures.

DETAILED DESCRIPTION OF THE PREFERRED EMBODIMENTS

Figure 1:
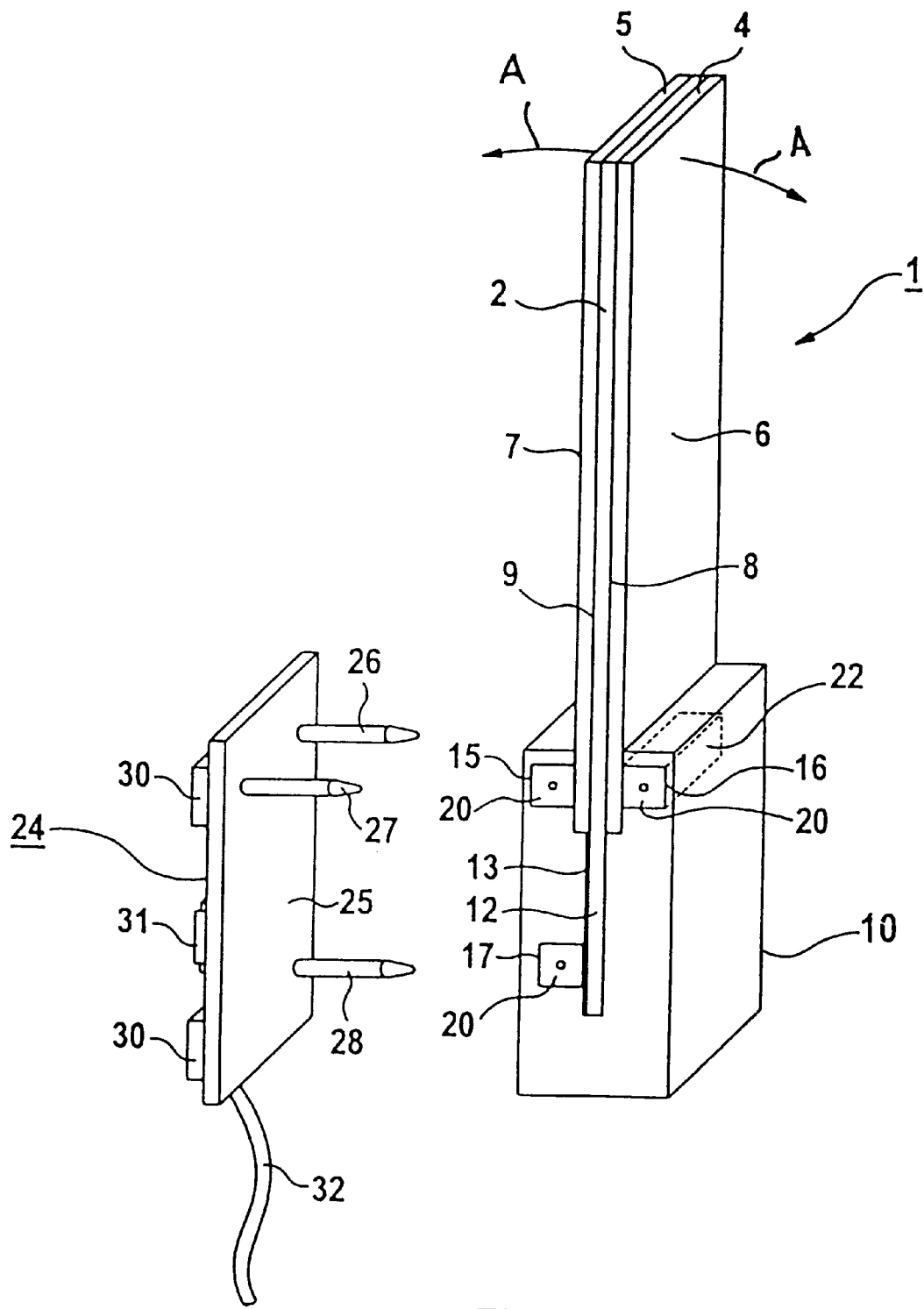
FIG. 1 shows a piezoelectric bending transducer with a connector base, with three electrical plug-in contacts comprising an elastomer, and a plug for connecting to the contacts, in accordance with an embodiment of the present invention.

FIG. 1 shows a piezoelectric bending transducer 1 with a flat supporting body 2 having a first piezoelectric coating 4 and a second piezoelectric coating 5 applied to it on its respective sides. The supporting body 2 is typically an electrically conductive epoxy resin reinforced with carbon fibers, although alternative compositions and constructions are possible. The piezoelectric coatings 4 and 5 are applied as a lead-zirconate-titanium based piezoceramic. Each of the piezoelectric coatings 4 and 5 has an outer contact area 6 and 7, respectively, and an inner contact area 8 and 9, respectively. The outer contact areas 6 and 7 and the inner contact areas 8 and 9 are formed as thin metallic coatings. The inner contact areas 8 and 9 are in electrical contact with the supporting body 2.

For connection to a control voltage, the piezoelectric bending transducer 1 is anchored at its one end in a connector base 10. The other end of the piezoelectric bending transducer 1 is freely movable. The supporting body 2 and piezoelectric coatings 4 and 5 are inserted into a corresponding clearance in the connector base 10 and are adhesively bonded to it in a fixed manner. The connector base 10 itself is a suitable electrically insulating plastic material, typically produced by an injection-molding process.

For a good mechanical connection and to simplify electrical connection thereto, the supporting body 2 extends beyond the piezoelectric coatings 4 and 5 into the connector base 10. In addition, the coating-free exposed end 12 of the supporting body 2 located in the connector base 10 has a copper covering 13 on one side.

The first outer contact area 6 and the second outer contact area 7 can be connected via associated electrical plug-in contacts 15 and 16, respectively, to an external voltage source. Similarly, the electrically conductive supporting body 2 has associated with it a supporting body electrical plug-in contact 17 for connection to a pole of an external voltage source. Each electrical plug-in contact 15, 16 and 17 is designed as a blind hole 22 that is machined into the connector base 10 and then filled with an electrically conductive elastomer 20. The elastomer 20 is preferably a silicone rubber impregnated with silver particles. The blind holes 22 are filled with this silicone rubber composition in liquid form, which subsequently cures.

The blind holes 22 are essentially right-parallelepipedal cavities, the wall of one longitudinal side of each of which is formed by part of the area to be contacted (that is, the coatings 4, 5 and the copper covering 13). In this way, there is intimate surface contact of the elastomer 20 and the area to which an electrical connection is to be made, so that a dependable electrical connection is ensured. In the connector base 10, the elastomer 20 of the plug-in contact 17 is in contact with the copper covering 13 of the supporting body 2, and consequently with the inner contact areas 8 and 9. The elastomer 20 of the plug-in contacts 15 and 16 is in electrical connection with the outer contact areas 6 and 7, respectively.

For actuation of the piezoelectric bending transducer 1, a connection to an external control device is established via a plug member 24. For this purpose, the plug 24 has contact pins 26, 27 and 28, which can be inserted into the plug-in contacts 15, 16 and 17, respectively. A surface of the elastomer 20 of the plug-in contact inserts 15, 16 and 17 is accessible for insertion of the contact pins 26, 27 and 28. The elastomer 20 of the plug-in contacts 15, 16 and 17 thereby encloses the contact pin 26, 27 and 28, respectively, by deformation of the elastomer, whereby a positive, dependable electrical connection is established between the pins and their respective contacts. The cavities forming the plug-in contacts 15, 16 and 17 are exposed on one side of the connector base 10 to enable insertion of the contact pins 26, 27 and 28.

The reversible deformability of the elastomer allows the plug-in connection to be released and reestablished repeatedly without the electrical connection suffering as a result, even though the elastomer may not completely recover after withdrawal of a contact pin (as indicated by the small holes in the plug-in contacts shown in the figures). In investigations with silicone rubber as the elastomer 20, the electrical connection did not suffer in any ascertainable way after 50 cycles of withdrawing and reinserting the contact pins to make the plug-in connection.

The plug 24 itself comprises a board 25 on which various electronic components 30 and 31 are arranged along with the contact pins 26, 27 and 28. The board 25 converts control signals from an external control unit (not shown), fed in via a connection cable 32, into power signals for actuation of the piezoelectric bending transducer 1.

In one example, the piezoelectric bending transducer 1 is actuated by applying a voltage of approximately 200 volts to the plug-in contacts 15 and 16 in the direction of polarization of the piezoceramic coatings. The plug-in contact 17, which is electrically connected to the inner contact areas 8 and 9, thus has the potential of the plug-in contact 15 and the potential of the plug-in contact 16 selectively applied to it for deflecting the free end of the piezoelectric bending transducer 1 in the desired direction. In this way, either the piezoceramic of the piezoelectric coating 5 or the piezoceramic of the piezoelectric coating 4 is subjected to an electromagnetic field in its direction of polarization and thereby contracts. The free end of the bending transducer 1 bends in a way corresponding to the depicted arrows A, that is, in one case to the left and in the other case to the right, depending on the direction of application of the electromagnetic field.

Figure 2:
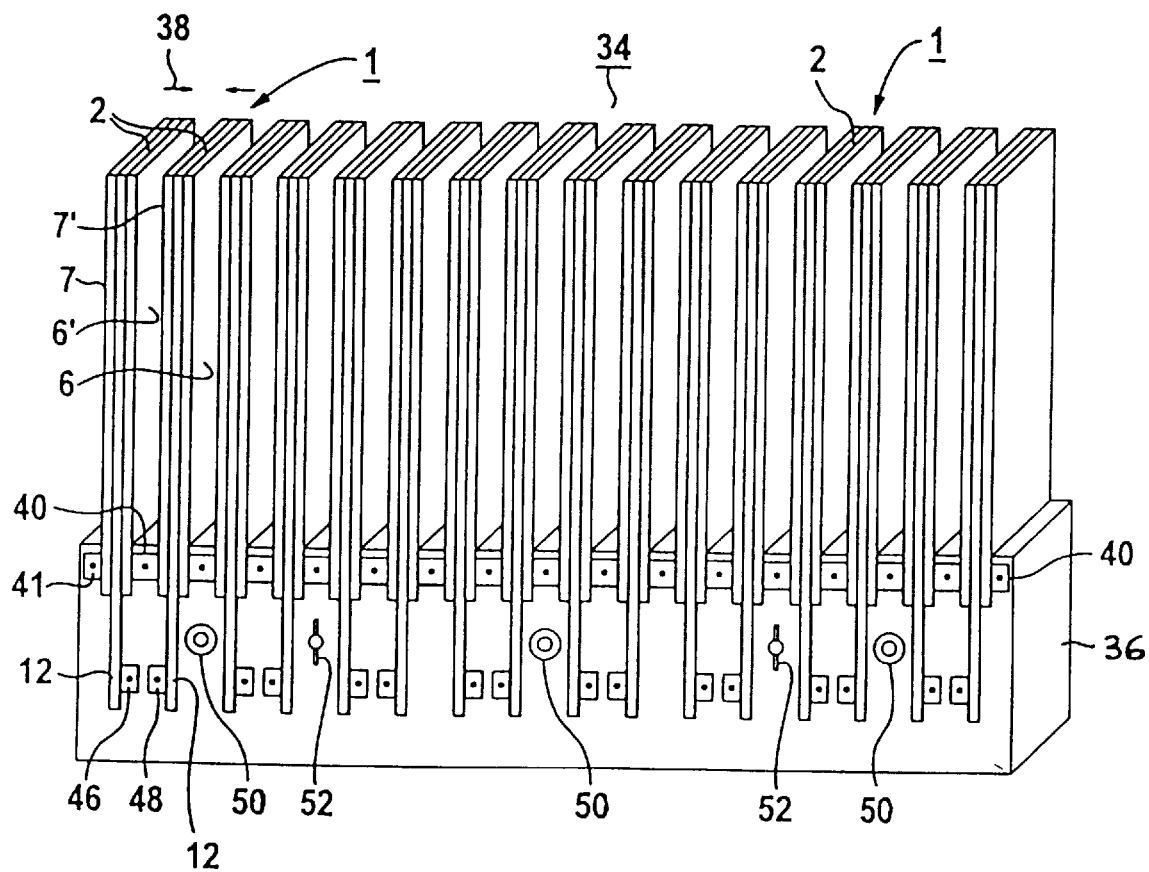
FIG. 2 shows a transducer module comprising sixteen piezoelectric bending transducers like that shown in FIG. 1, arranged in parallel and grouped together in a common terminal strip, with the electrical connections for the bending transducers being provided in each case as plug-in contacts with an elastomer.

FIG. 2 depicts a transducer module 34 comprising sixteen bending transducers 1 arranged in parallel. These piezoelectric bending transducers 1 are constructed in the same way as those shown in FIG. 1. The main difference is that the insulating connector base 10 of the FIG. 1 embodiment is combined into a common terminal strip 36. Each supporting body 2 is in this case extended beyond the piezoelectric coating into the terminal strip 36, as depicted with respect to the connector base in FIG. 1. The piezoelectric coating and the coating-free end 12 of the supporting body 2 of each piezoelectric bending transducer 1 are inserted into a clearance in the terminal strip 36 and adhesively bonded to the terminal strip 36, as described above.

By referring to FIG. 1 and FIG. 2 together, it will be appreciated that neighboring piezoelectric bending transducers 1 of the transducer module 34 are respectively turned by 180 degrees with respect to one another in a way corresponding to the direction of polarization 38 of the piezoceramic coatings 4 and 5. When the piezoelectric bending transducers 1 are operated in the way already described, the adjacent neighboring outer contact areas 6' and 7' are therefore at the same electric potential. For this reason, neighboring outer contact areas of the piezoelectric bending transducers 1 of the module 34 can be contacted via a common electrical plug-in contact 40. Successive plug-in contacts 41, 40 are connected alternately to different potentials.

The terminal strip 36 of the transducer module 34 has a transverse channel for producing the electrical plug-in contacts for the respective outer contact areas of the electrical bending transducers 1. After insertion of the piezoceramic coated supporting bodies 2, the transverse channel is subdivided into chambers which are separate from one another and which form the respective plug-in contacts after filling with the electrically conductive silicone rubber composition described above.

Electrical contact with the supporting bodies 2 is effected using electrical plug-in contacts 46 and 48 formed in the same manner as the plug-in contact 17 described in connection with FIG. 1. In the transducer module 34, the electrical plug-in contacts 46 and 48 lie directly opposite one another in order to form space for fastening elements on the terminal strip 36. Consequently, the terminal strip 36 according to FIG. 2 has bores 50 for mounting the terminal strip 36 onto a housing (not shown) and arresting pins 52 for fixing the position of the transducer module 34 on the housing.

The transducer module 34 is suitable in particular for providing pattern information to the needles of a knitting machine. Depending on the position of the free ends of the piezoelectric bending transducers 1 as controlled by the actuation thereof, the needle assigned to a particular bending transducer is or is not used for knitting. Of course, the principle of operation applies equally for other applications, and the transducer module 34 in general can be used for any application in which electronic information must be converted into information that can be mechanically sensed.

For actuating the transducer module 34 according to FIG. 2, an electronics board (not shown) is provided. Such a board would be equipped with corresponding power electronics and would engage with corresponding contact pins into the electrical plug-in contacts 40, 41, 46, 48 of the terminal strip 36 (also see FIG. 3 in this respect). The electronics of the board in this case convert corresponding control signals into power signals for actuating the piezoelectric bending transducers 1. The free end of each piezoelectric bending transducer 1 of the module 34 shown can assume three defined states. State I corresponds to deflection to the left, state III corresponds to deflection to the right and state II corresponds to the unactuated state of rest of the piezoelectric bending transducer 1.

Figure 3:
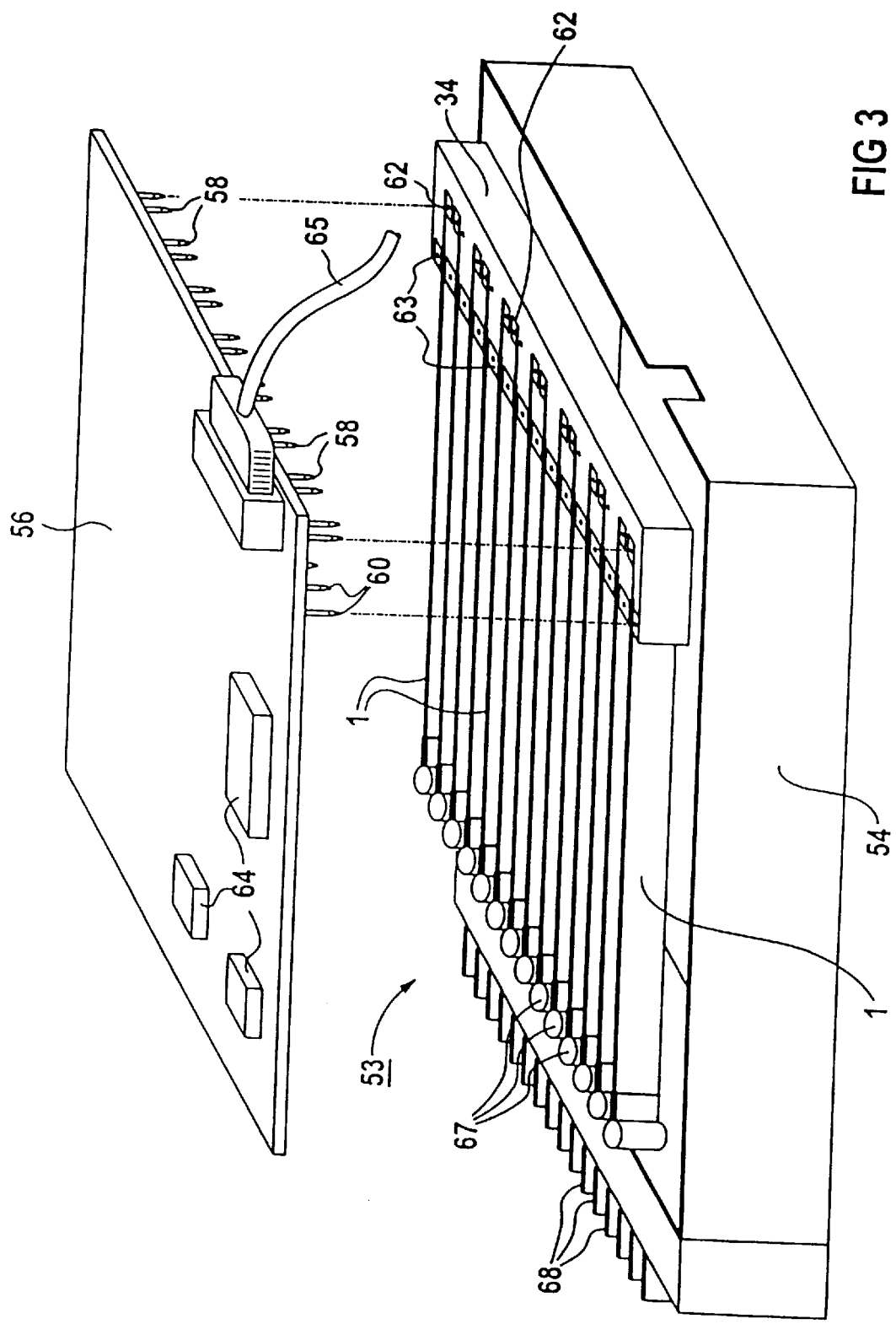
FIG. 3 shows a control module with plural piezoelectric bending transducers, suitable for driving the needles of a circular knitting machine, the control module including a housing part, a bending transducer module, and an electronics board, with the electrical connection between the electronics board and the bending transducer module being arranged such that it is releasable via contact pins engaging plug-in contacts.

FIG. 3 shows a control module 53 of a modular unit for controlling the needles of a circular knitting machine. The control module 53 is made up of a housing 54, to which is mounted the transducer module 34 according to FIG. 2, and a circuit board 56 for actuating the piezoelectric bending transducers 1 of the transducer module 34. The board 56 has electrical contact pins 58 and 60, which can be inserted into the corresponding plug-in contacts 62 and 63 of the module 34, as discussed in connection with FIGS. 1 and 2. Also arranged on the board 56 is circuitry with various electronic components 64 that convert control signals received via a connection cable 65 from an external control unit (not shown) into power signals for the piezoelectric bending transducers 1 of the transducer module 34.

A cover fits on the housing 54 and encloses the transducer module 34 and the circuit board 56 to complete the control module 53. The cover is omitted from FIG. 3 for reasons of overall clarity to reveal the interior of the control module.

Each of the piezoelectric bending transducers 1 has at its free movable end an adhesively attached cylindrical thickened portion 67. The thickened portion 67 engages in the rear part of a rocker (not shown) movably arranged on the housing 54. The front part of the rocker forms a control armature 68, the position of which is ultimately sensed by the control board of the circular knitting machine.

The modular construction of the control module 53 allows individual components to be exchanged rapidly and without any problem. Effecting the electrical connections with cooperating plug-in contacts 62, 63 and pins 58, 60 reduces the number of components which can fail, in comparison with a conventional control module in which each individual piezoelectric bending transducer 1 has separate connecting wires and soldered contacts. Furthermore, the assembly of the control module 53 can be fully automated. Manual soldering of connecting wires is no longer required. The elastomer plug-in contacts 62, 63 ensure that the entire control module 53 can be operated dependably with a long service life and no maintenance.

It will be appreciated from the above description that an important object of the invention is achieved by providing a piezoelectric bending transducer with a contact area in touching contact with an electrically conductive elastomer designed for releasably accommodating a contact pin of an electrical plug-in connector by virtue of the partially elastic deformation of the elastomer.

The touching contact of the elastomer with the transducer contact area may in different embodiments take the form of a point or a surface area. The introduction or insertion of the contact pin into the elastomer establishes an electrically conductive connection between the contact pin and the transducer contact area in touching contact with the elastomer. As a result of the reversible deformability of the elastomer, the contact pin can be repeatedly inserted into the elastomer and pulled out, without causing any deterioration in the electrical connection between the contact pin and the contact area.

The invention offers the advantage of dependable electrical contact of contact areas of the piezoelectric bending transducer without requiring additional components that are subject to failure or malfunction, such as a soldered contact or connecting wire. The reversible deformability of the elastomer also provides a dependable and releasable electrical connection using a contact pin.

At the same time, the invention allows a defective piezoelectric bending transducer to be exchanged without any problem. In addition, the contacting arrangement of the invention takes up less installation space than comparable soldered contacts according to the prior art. Applying an elastomer to a contact area of the piezoelectric bending transducer also allows the production process to be automated. For example, the transducer contact area simply has to be inserted into the elastomer, or the elastomer can be pressed, pushed or adhesively bonded onto the contact area.

In an advantageous embodiment of the invention, one end of the piezoelectric bending transducer is fixedly connected to a connector base, the elastomer filling a bore or a clearance in the connector base, with the elastomer having a freely accessible portion for the insertion of the contact pin and at least part of a wall of the bore or clearance being formed by part of the contact area. The bore or the clearance in the connector base may be formed for example as a blind hole into which the elastomer is poured in the liquid state. Forming part of the wall of the bore or clearance by part of the contact area itself has the effect that, after curing, the elastomer is in intimate touching contact with the contact area and is consequently conductively connected to it. To produce a plug-in contact of this type, the bending transducer is, for example, inserted into a longitudinal slot in the connector base, a lateral clearance being provided at one point of the longitudinal slot. This clearance is subsequently filled with the elastomer, and the elastomer is cured. The connector base itself is formed from an electrically insulating material, for example, a plastic.

The elastomer is preferably a silicone rubber with incorporated metallic particles, in particular silver. Silicone rubber is easy to handle in the liquid state and exhibits outstanding reversible deformability after curing. Appropriate tests have shown that, releasing and inserting the contact pin over 50 times did not influence the electrical contact with the contact area. The incorporation of silver in particular ensures high electrical conductivity of the silicone rubber.

In an alternative embodiment, the elastomer can be a conductive plastic foam. A plastic foam of this type is used for example as a packaging material for protecting highly sensitive electronic equipment against electromagnetic effects. If the elastomer is a plastic foam, processing can simply take the form of cutting the plastic foam to size.

In a further advantageous aspect of the invention, both the outer and inner contact areas of the transducer utilize an electrical plug-in contact with an elastomer, the inner contact area extending together with the transducer supporting body beyond a piezoceramic coating in the longitudinal direction of the supporting body into a connector base, thus enabling contact therewith via the elastomer. This allows a spatial separation of the electrical connection of the inner and outer contact areas of the piezoelectric bending transducer. In particular, as a result of continuing the inner contact area without a coating into the connection piece, electrical contact with the inner contact area can also be provided in a simple way via an elastomer in touching contact with the contact area.

It is also advantageous to provide the piezoelectric bending transducer on both sides with the piezoelectrically active coating, with an outer contact area in each case. A bending transducer of this type allows bending in two opposite directions with a high actuating force.

It is expedient for contacting the inner contact area if the supporting body itself consists of an electrically conductive material and itself forms the inner contact area. For the contacting of the inner contact area, all that is required in such a configuration is for the electrically conductive elastomer to be in touching contact with the supporting body.

With respect to the module with a plurality of piezoelectric bending transducers, an important object of the invention is achieved by grouping ends of the plural bending transducers together in a common terminal strip, and by providing an electrical plug-in contact for contacting the contact areas. The plug-in contact is effected by using an elastomer that is in touching contact with a respective contact area, is arranged in a bore or clearance in the terminal strip and is designed for releasably accommodating a contact pin by means of partially elastic deformation.

The module provides for dependable electrical contact with the bending transducers via a corresponding terminal strip with contact pins, which are pushed into the respective bores or cavities filled with an elastomer. The releasable connection allows the module as a whole to be quickly exchanged and replaced by another, without necessitating intricate and difficult manipulation of the component parts of the module.

In an advantageous embodiment, the module has bending transducers, each coated on both sides with a piezoceramic. The directions of polarization of the piezoceramic coatings of each bending transducer respectively point in the same direction and the directions of polarization of mutually facing piezoceramic coatings of neighboring bending transducers point in opposite directions, with the mutually facing outer contact areas of the piezoceramic coatings of neighboring bending transducers contacted jointly by an elastomer.

That the directions of polarization of the piezoceramic coatings of a bending transducer point in the same direction allows the bending transducer to be deflected in two opposite directions by applying corresponding control voltages, without one of the piezoceramic coatings being operated counter to its direction of polarization. For this purpose, a predetermined operating voltage (generally this is approximately 200 V) is applied in the direction of polarization of the two piezoceramic coatings between the outer contact areas. The potential of the one outer contact area and the potential of the other outer contact area are alternately applied to the inner contact areas in electrical contact with each other. In this way, the two piezoceramic coatings alternately contract and lead to a deflection of the free end of the bending transducers, in one case in one direction and in the other case in the other direction. The electrical contact of the inner contact areas with each other can be effected, for example, using an electrically conductive supporting body.

If bending transducers of this type are arranged in the module alternately with directions of polarization opposed to one another, the mutually facing outer contact areas of the piezoceramic coatings of neighboring bending transducers can be connected to the same potential. An elastomer can be used for the electrical connection, it being placed in each case between the outer contact areas. An arrangement of this type offers the great advantage that the bending transducers can be arranged in the module such that they follow closely one after the other with minimum spacing. Therefore, more bending transducers per unit area can be made available for transferring information. As a result of the way in which the bending transducers operate only in the direction of polarization of the piezoceramic coating and as a result of the reduction in the number of electrical connections, a module of this type also has a high level of operational dependability and a low failure rate.

Each transducer supporting body advantageously comprises an electrically conductive material, which has an exposed end that extends beyond the coating into the terminal strip for providing an electrical plug-in contact there using the elastomer. Examples of electrically conductive materials are a metal or an electrically conductive plastic, such as an epoxy resin reinforced with carbon fibers. If the supporting body is an electrically conductive material, only one electrical connection is required to effect contact of the inner contact areas of each bending transducer. The extension of an exposed end of the supporting body without coating into the terminal strip allows the electrical connection for the inner contact areas to be spatially separated from the electrical connections of the outer contact areas. Moreover, the extended supporting body gives the entire bending transducer greater mechanical stability in the terminal strip. For even better electrical contact with the elastomer, the supporting body may be provided on the side facing the elastomer with a covering of a copper foil.

Although preferred embodiments of the invention have been depicted and described, it will be understood that various modifications and changes can be made other than those specifically mentioned above without departing from the spirit and scope of the invention, which is defined solely by the claims that follow.

What is claimed is:

1. A piezoelectric bending transducer comprising:
    a flat supporting body having a piezoelectrically active coating on at least one side thereof, said coating having an inner contact area facing said supporting body and an outer contact area facing away from said supporting body; and
    at least one electrical plug-in contact electrically connected to one of said contact areas, said plug-in contact including an electrically conductive elastomer for accepting a contact pin that deforms said elastomer when inserted thereinto.

2. The piezoelectric bending transducer of claim 1, wherein:
    said supporting body includes a second piezoelectrically active coating on a second side thereof, said second coating having an inner contact area facing said supporting body and an outer contact area facing away from said supporting body; and
    said transducer comprises at least two said electrical plug-in contacts, each being electrically connected to a respective said outer contact area of one of said first and second coatings.

3. The piezoelectric bending transducer of claim 1, further comprising a connector base fixedly securing one end of said supporting body, wherein said plug-in contact includes a cavity in said connector base having said elastomer therein, wherein at least a portion of a wall of said cavity is formed by a surface of said transducer and said plug-in contact has a portion accessible for insertion into said elastomer of a contact pin.

4. The piezoelectric bending transducer of claim 3, wherein said elastomer is a silicone rubber impregnated with metallic particles.

5. The piezoelectric bending transducer of claim 3, wherein said metallic particles are silver.

6. The piezoelectric bending transducer of claim 3, wherein said elastomer is a conductive plastic foam.

7. The piezoelectric bending transducer of claim 3, wherein said coating exposes a surface of said supporting body at said one end thereof, said exposed surface being in electrical contact with said inner contact area of said coating, said transducer further comprising:
    a supporting body plug-in contact including a cavity in said connector base having said elastomer therein and having a wall thereof formed by said exposed surface of said supporting body, wherein said supporting body plug-in contact has a portion accessible for insertion into said elastomer of a contact pin; and
    an outer contact area plug-in contact including a cavity in said connector base having said elastomer therein and having a wall thereof formed by a portion of said outer contact area, wherein said outer contact area plug-in contact has a portion accessible for insertion into said elastomer of a contact pin.

8. The piezoelectric bending transducer of claim 7, wherein:
    said supporting body includes a second piezoelectrically active coating on a second side thereof, said second coating having an inner contact area facing said supporting body and an outer contact area facing away from said supporting body: and
    said transducer includes a second outer contact are a plug-in contact including a cavity in said connector base having said elastomer therein and having a wall thereof formed by a portion of said out er contact area of said second coating, wherein said second outer contact area plug-in contact has a portion accessible for insertion into said elastomer of a contact pin.

9. The piezoelectric bending transducer of claim 8, wherein said accessible portions of said cavities comprise cavity surfaces exposed on one side of said connector base.

10. The piezoelectric bending transducer of any of claims 7 to 9, wherein said supporting body comprises a conductive material.

11. The piezoelectric bending transducer of claim 10, wherein said piezoelectrically active coating comprises a piezoceramic material.

12. The piezoelectric bending transducer of claim 10, wherein said supporting body includes metallic covering in electrical contact with said elastomer of said supporting body plug-in contact.

13. The piezoelectric bending transducer of claim 12, wherein said contact areas include metallic coatings.

14. A transducer module comprising:
    a plurality of adjacent piezoelectric bending transducers, each including a flat supporting body having a piezoelectrically active coating on at least one side thereof, said coating having an inner contact area facing said supporting body and an outer contact area facing away from said supporting body; and
    a common terminal strip into which one end of each said transducer is fixed, wherein said terminal strip has a plurality of electrical plug-in contacts each including a cavity in said terminal strip having therein an electrically conductive elastomer in contact with a contact area of a corresponding said transducer for accepting a contact pin that deforms said elastomer when inserted thereinto.

15. The transducer module of claim 14, wherein:
    said supporting body includes a second piezoelectrically active coating on a second side thereof, said second coating having an inner contact area facing said supporting body and an outer contact area facing away from said supporting body;
    said first and second piezoelectrically active coatings comprise a piezoceramic material, the directions of polarization of facing said coatings on adjacent said transducer pointing in different directions; and
    said facing coatings on adjacent said transducers are in contact with said elastomer of one said plug-in contact.

16. The transducer module of claim 15, wherein:
    said supporting body of each said transducer comprises a conductive material;
    said coatings expose a surface of said supporting body at said end thereof, said exposed surface being in electrical contact with said inner contact areas of said coatings; and
    said terminal strip includes a plurality of supporting body plug-in contacts, each including a cavity in said terminal strip having therein an electrically conductive elastomer in contact with said exposed end of a corresponding supporting body for accepting a contact pin that deforms said elastomer when inserted thereinto.

17. A control module comprising:

a housing;

a transducer module enclosed in said housing and including a plurality of adjacent piezoelectric bending transducers, each including a flat supporting body having a first piezoelectrically active coating on a first side thereof, said first coating having an inner contact area facing said supporting body and an outer contact area facing away from said supporting body, a second piezoelectrically active coating on a second side thereof, said second coating having an inner contact area facing said supporting body and an outer contact area facing away from said supporting body, and a common terminal strip into which one end of each said transducer is fixed, wherein said terminal strip is secured in said housing and has a plurality of electrical plug-in contacts each including a cavity in said terminal strip having therein an electrically conductive elastomer in contact with a contact area of a corresponding said transducer for accepting a contact pin that deforms said elastomer when inserted thereinto;

circuitry for selectively actuating said transducers in response to control signals; and individual control elements mounted to said housing for movement in response to actuation of corresponding said transducers.

* * * * *